US006060962A

United States Patent [19]

Sokolov et al.

[11] Patent Number: 6,060,962

[45] Date of Patent: May 9, 2000

[54] PHASE ANGLE MODULATOR FOR MICROWAVES

[75] Inventors: Vladimir Sokolov, Shakopee, Minn.; Robert M. Dwarkin, Batavia, Ill.

[73] Assignee: TLC Precision Wafer Technology Inc., Minneapolis, Minn.

[21] Appl. No.: 09/167,442

[22] Filed: Oct. 6, 1998

Related U.S. Application Data

[63] Continuation-in-part of application No. 08/910,941, Aug. 2, 1997, abandoned.

[51] Int. Cl.[7] .......... H03H 7/20

[52] U.S. Cl. .......... 333/161; 333/164

[58] Field of Search .......... 333/156, 161, 333/164

[56] References Cited

U.S. PATENT DOCUMENTS 3,436,691 4/1969 Hoffman et al. .......... 333/164
3,768,045 10/1973 Chung .......... 333/164
3,914,708 10/1975 Stover et al. .......... 333/164 X
4,638,269 1/1987 Dawson et al. .......... 333/164
5,014,018 5/1991 Rodwell et al. .......... 333/20
5,557,140 9/1996 Nguyen et al. .......... 257/596

*Primary Examiner*—Justin P. Bettendorf
*Attorney, Agent, or Firm*—Roger W. Jenson

[57] ABSTRACT

An analog phase modulator is provided for linearly phase modulating a high carrier frequency input signal in proportion to an applied bias signal. A first variable reactance network, including at least a pair of variable reactance devices separated by an approximately ¼ wave length transmission line segment, is capacitively coupled to an in-phase port of a power divider network, and a second identical variable reactance network is capacitively coupled to a quadrature phase shifted port of the power divider network. A bias source signal is applied to each of the first and second variable reactance networks through identical bias filters, each including a high impedance transmission line segment serially connected between the bias source and the variable reactance network, and a low impedance transmission line segment shunt segment at the juncture of the high impedance transmission line segment and the bias source input port.

30 Claims, 5 Drawing Sheets

PHASE ANGLE MODULATOR FOR MICROWAVES

This is a continuation-in-part of U.S. patent application Ser. No. 08/910,941, filed on Aug. 2, 1997, now abandoned.

FIELD OF THE INVENTION

The present invention relates generally to a low loss phase angle modulator for microwave applications. The inventive circuit in accordance with the present invention is readily implementable utilizing standard monolithic or hybrid manufacture processing techniques.

BACKGROUND OF THE INVENTION

Analog phase shifters or modulators are well known, as disclosed for example in U.S. Pat. Nos. 4,288,763; 4,638,629; 4,837,532; 5,014,023 and 5,453,720. Such phase shifters utilize hyperabrupt varactor diodes known in the art and similar to that set forth in a paper by Niehenke et al., entitled Linear Analog Hyperabrupt Varactor Diode Phase Shifters, 1985 IEEE MTT-S Digest, pp 657–660. Further, abrupt and hyperabrupt varactors having predetermined capacitance-voltage characteristics as a function of doping profile are taught in U.S. Pat. No. 3,914,708, entitled, "BI-STATE Varactor Phase Modulation Network and Process for Constructing Same, issued to Stover, et al., U.S. Pat. No. 5,014,018, entitled Nonlinear Transmission Line for Generation of Picosecond Electrical Transients, issued to Rodwell, et al., and U.S. Pat. No. 5,557,140, entitled Process Tolerant, High Voltage, Bi-Level Capacitance Varactor Diode, issued to Nguyen. These aforesaid patents and publications being incorporated herein by reference thereto.

Still another example is U.S. Pat. No. 5,119,050, entitled Low-Loss 360 Degree X-Band Analog Phase Shifter, issued to Upshar, et al. This latter mentioned patent employs a pair of variable reactance networks directly connected to a 3-dB quadrature signal coupler or power divider to produce a 180 degree variable phase shift, and a second pair is directly connected to another 3-dB quadrature signal coupler to obtain an additional 180 degree phase shift. Impedance matching networks are also employed to reduce reflections and insertion loss.

In the just aforementioned patent, in order to obtain a phase shift range of greater than 180 degrees, two 3-dB couplers are required along with two additional variable reactance networks. These additional components lead to high insertion losses, reduction in linearity, and reduced bandwidth. Furthermore, the complexity caused by the increased component count diminishes the viability of a low cost and reliable production of a Monolithic Microwave Integrated Circuit (MMIC) implementation.

In one embodiment of the present invention, the variable reactance devices are varactor diodes which are selected so as to have a predetermined capacitance voltage characteristic so as to offset other circuit component induced nonlinearities so as to enhance the linearity performance of the phase modulator. In accordance with one aspect of the present invention the varactor diode devices may be constructed so as to have a selected doping profile so as to yield the desired capacitance-voltage characteristic.

SUMMARY OF THE INVENTION

It is an object of the present invention to provide a phase modulator for high frequency applications.

It is another object of the present invention to provide a phase modulator having a variable phase shift range in excess of 180 degrees with low insertion loss, high linearity, and simplicity of design.

It is another object of the present invention to provide a phase modulation circuit which is easily implemented by hybrid or MMIC manufacture processing techniques.

In accordance with the present invention, an analog phase modulator is provided for linearly phase modulating a microwave or mm-wave input signal in proportion to an applied bias signal. A first variable reactance network, including at least a pair of variable reactance devices separated by an approximately ¼ wave length transmission line segment, is capacitively coupled to the in-phase output port of a quadrature power divider network, and a second identical variable reactance network is capacitively coupled to the 90 degree phase shifted output port of the quadrature power divider network. A bias source signal is applied to each of the first and second variable reactance networks through identical bias filters, each including a high impedance serially connected transmission line segment between the bias source and the variable reactance network, and a low impedance transmission line segment shunt at the juncture of the high impedance transmission line segment and the bias signal source input.

Other objects, features and advantages of the present invention will become apparent to those skilled in the art through the description of the preferred embodiment, claims and drawings which follow.

DETAILED DESCRIPTION OF THE INVENTION

Figure 1:
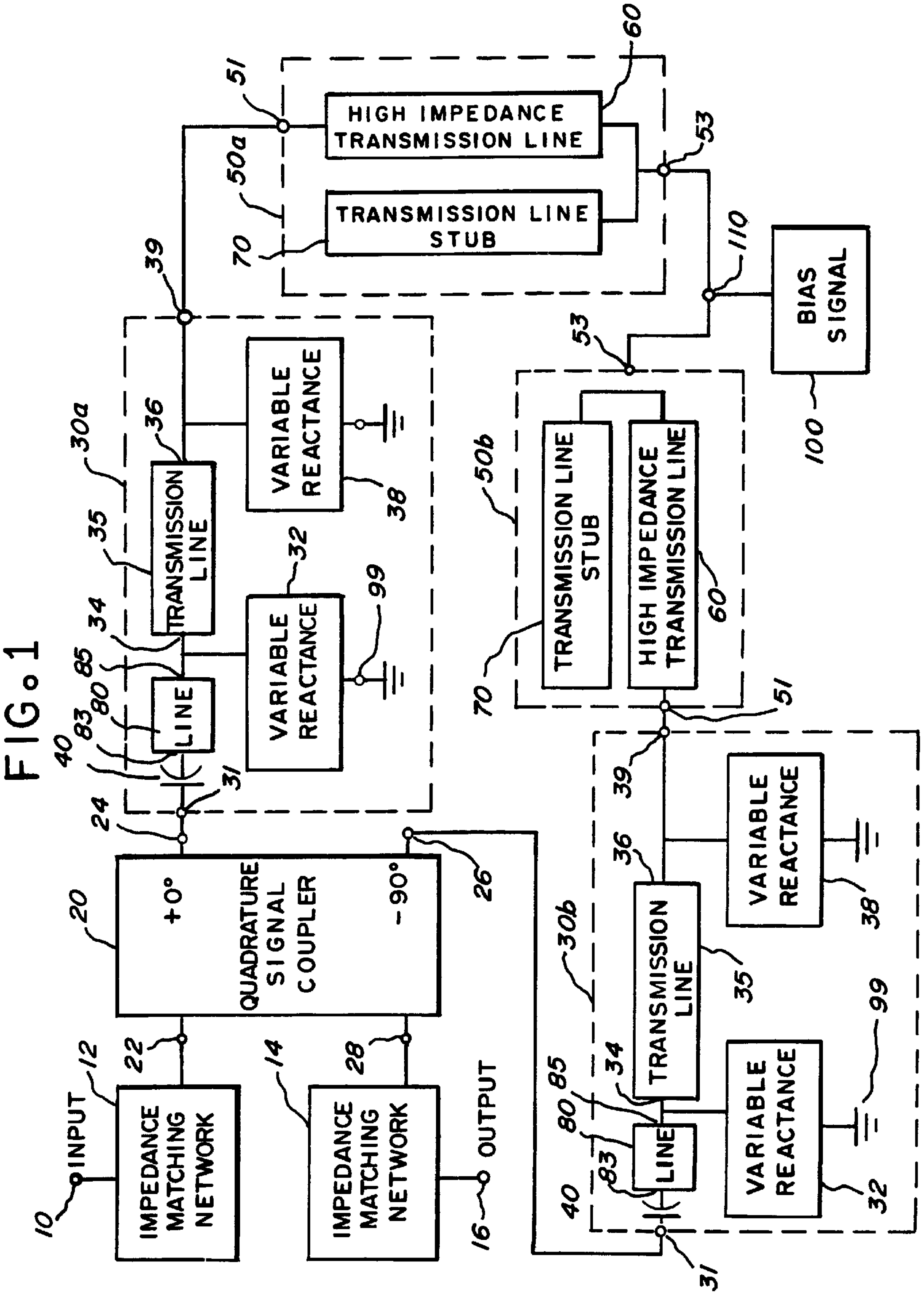
FIG. 1 is a schematic block diagram of a phase modulator in accordance with the present invention.

Illustrated in FIG. 1 is a schematic block diagram of the analog phase modulator in accordance with the present invention, operable for linearly phase modulating a microwave or mm-wave input carrier signal provided at an input terminating means 10. A linearly phase modulated output signal is provided at an output terminating means 16 where the analog phase shift of the output signal with respect to the input carrier signal is in proportion to an applied DC voltage or bias signal from a bias signal source 100.

A quadrature signal coupler 20, more specifically a 3-dB quadrature coupler, is further illustrated as having (i) an input port 22, (ii) an 'in phase' output port 24 which is terminated with a variable reactance impedance network 30*a*, (iii) a 'phase shifted' output port 26 which is terminated with a variable reactance impedance network 30*b* identical to variable reactance network 30*a*, and (iv) an output port 28. The 'in phase' and 'phase shifted' notation for output ports 24 and 26 as described herein is common notation referring to the relative phase relationship of the quadrature output ports 24 and 26 relative to the signal input at input port 22.

Quadrature signal coupler 20 may be provided by wide array of circuit components, including discrete, hybrid, or monolithic, to provide the intended function of power splitting of the input signal power at the input port 22 between the "in-phase" and "phase-shifted" output ports as is well known. Quadrature signal coupler 20 may be implemented by an array of circuit implementations including, but not limited to a coupled line coupler, a 3 dB Lange coupler, a branch line coupler, and the like.

In accordance with the present invention, two identical variable reactance terminating impedance networks 30*a* and 30*b* are provided at output ports 24 and 26 to produce identical reflections of the input signal between output ports 24 and 26. As is well understood, the properties of a quadrature signal coupler are such that if the reactance networks 30*a* and 30*b* are identical, all of the signal power of the input signal at port 22 is nominally reflected to output port 28. The pair of reflections do not reflect back to the input port 22, but are instead recombined at output port 28 with minimum loss. In doing so, the input and output signals are distinctly separated and appear at two physically different ports, namely ports 22 and 28. All of such quadrature signal couplers which serve the same intended function, are intended to be within the true spirit and scope of the present invention.

Again referring to FIG. 1, first impedance matching network 12 is electrically connected between input terminating means 10 and input port 22, and a second impedance matching network 14 is electrically connected between output terminating means 16 and output port 28. Impedance matching networks 12 and 14 are only shown to indicate the importance of characteristic impedance matching of the signal input and output signal line connections with respect to coupler 20. However, they may be unnecessary or omitted for proper impedance characteristic design of quadrature signal coupler 20.

In accordance with the present invention, thereshown in FIG. 1 are a pair of identical variable reactance networks 30*a* and 30*b* as indicated by the dashed boxes. Each of the variable reactance networks 30*a* and 30*b* includes a pair of electrical node terminating means 31 and 39, a capacitance 40, a pair of variable reactance means 32 and 38, and transmission line segments 35 and 80. Electrical node terminating means 31 of variable reactance network 30*a* serves as an RF input port which is electrically connected to output port 24 of quadrature signal coupler 20. Electrical node terminating means 31 of variable reactance network 30*b* serves as an RF input port which is electrically connected to output port 26 of quadrature signal coupler 20.

One side of a capacitance 40 is electrically connected to electrical node terminating means 31, and the other side is electrically connected to one terminating end 83 of transmission line segment 80. The other end 85 of transmission line segment 80 is electrically connected to the juncture of one terminating means of variable reactance means 32 and one terminating end 34 of transmission line segment 35. The other terminating means of variable reactance 32 is electrically connected to circuit ground 99. The opposite terminating end 36 of transmission line segment 35 is electrically connected to electrical node terminating means 39. Variable reactance means 38 has one terminating means thereof also connected to electrical node terminating means 39, and another terminating means thereof also electrically connected to circuit ground 99.

Electrical node terminating means 39 of each of the variable reactance networks 30*a* and 30*b* serves as the bias signal connection node as aforesaid, and is electrically connected to bias signal source 100 through a bias filter network 50*a* and 50*b*, respectively. Each of the bias filter networks 50*a* and 50*b* is intended to couple the bias signal source to the variable reactance network without presenting an additional load to carrier frequency signals circulating through the variable reactance networks 30*a* and 30*b*. Each of the bias filter networks 50*a* and 50*b* includes a high impedance transmission line segment 60 and a low impedance transmission line segment stub 70. A first juncture 53 is electrically connected to one end of transmission line segment 60, one end of transmission line segment stub 70, and also electrically connected to bias port 110. The other terminating end 51 of transmission line segment 60 of bias filter 50*a* is electrically connected to electrical node terminating means 39 of variable reactance network 30*a*, and the other terminating end of transmission line segment 60 of bias filter 50*b* is electrically connected to electrical node terminating means 39 of variable reactance network 30*b*.

Figure 2:
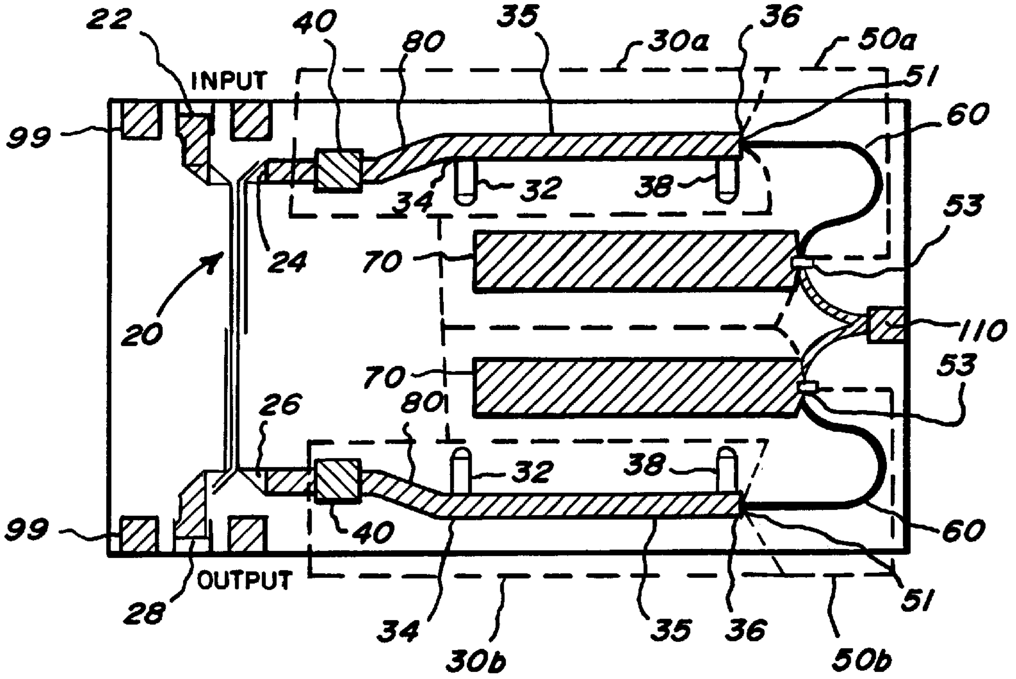
FIG. 2 is a transmission line layout diagram of the circuit of FIG. 1.

Illustrated in FIG. 2 is a monolithic microwave integrated circuit implementation (MMIC) of FIG. 1 where like components have retained the same numeral designations. The transmission line segment layout of FIG. 2 is generally symmetrical as is common practice, but which is preferred in the present invention. Furthermore, the impedance matching networks 12 and 14 have been omitted in FIG. 2 since they would be unnecessary in the MMIC if the standard 50 ohm characteristic impedance is selected for the quadrature signal coupler 20.

In the preferred embodiment of the invention, high impedance transmission line segment 60 is in the order of 70 ohms, and the transmission line segment stub 70 is a low impedance transmission line segment in the order of 30 ohms. The characteristic impedance of transmission line segment 35 is intended to be that of the external input impedance characteristic and is typically set at 50 ohms. Each of the transmission line segments 35, 60 and 70 are intended to be substantially near ¼ wave length transmission line segments or strips—i.e., a length designed to be substantially equivalent to the ¼ wave length of the carrier frequency intended to be phase modulated—i.e., the input signal at input node 10. Further, transmission line segment 80 in the preferred embodiment of the invention has a nominal 50 ohm characteristic impedance and less than a quarter wavelength long at the center frequency of the operating frequency range of the input carrier signal. This transmission line segment 80 is believe to positively affect the linearity performance of the overall phase modulator of the present invention.

The variable reactance devices 32 and 38 may be provided by a wide array of devices, including discrete, hybrid, or monolithic, to provide the intended function of a reactance which varies in relation to a control voltage or current as presented as an input to bias port 110. One such variable reactance device is commonly referred to as a "hyperabrupt" varactor diode represented as a series combination of a variable capacitance and diode as is well known in the art and also illustrated in, among others, the aforementioned U.S. Pat. Nos. 3,914,708 and 5,014,018 and 5,014,023 and 5,557,140. In one embodiment of the present invention, such varactor diodes may include those referred to as PN-junction and Schottky type varactor diodes constructed by a wide array of techniques so as to yield a selected capacitance voltage characteristic as will be more fully described. Further, variable reactance devices as used herein may also include variable inductance devices as used in superconducting circuits such as squid devices where a variable current is the bias signal source in contrast to a variable voltage signal source.

Figure 4:
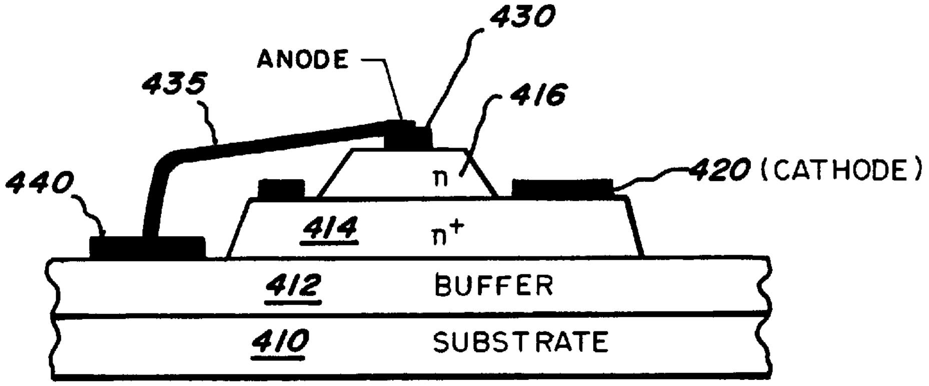
FIG. 4 is cross-sectional view of a planar hyperabrupt varactor.

Illustrated in FIG. 4 is a cross-sectional view of an exemplary construction of a planar hyperabrupt Schottky junction varactor diode which may be employed as the variable reactance means like those designated by numerals 32 & 38 as illustrated in FIG. 2, and which are well known in the art. The exemplary construction illustrated in FIG. 4 is intended to be consistent with the remaining circuit components of FIG. 2 and preferably consistent with MMIC technology. As illustrated in FIG. 4, the planar hyperabrupt varactor consists of a substrate 410 upon which is deposited successively a buffer layer or region 412, a contact layer or region 414, and an active layer or region 416. An ohmic contact 420 is deposited on the contact layer surrounding the active layer 416 and serves as the varactor cathode. A Schottky contact 430 is formed on active layer 416 and serves as the varactor anode along with air bridge electrical conductor 435 formed between the Schottky contact 430 and a metal electrode 440 formed on buffer 412. The metal electrode may be common with the circuit level which may include transmission lines formed on buffer layer 412 in accordance with MMIC technology.

Figure 5:
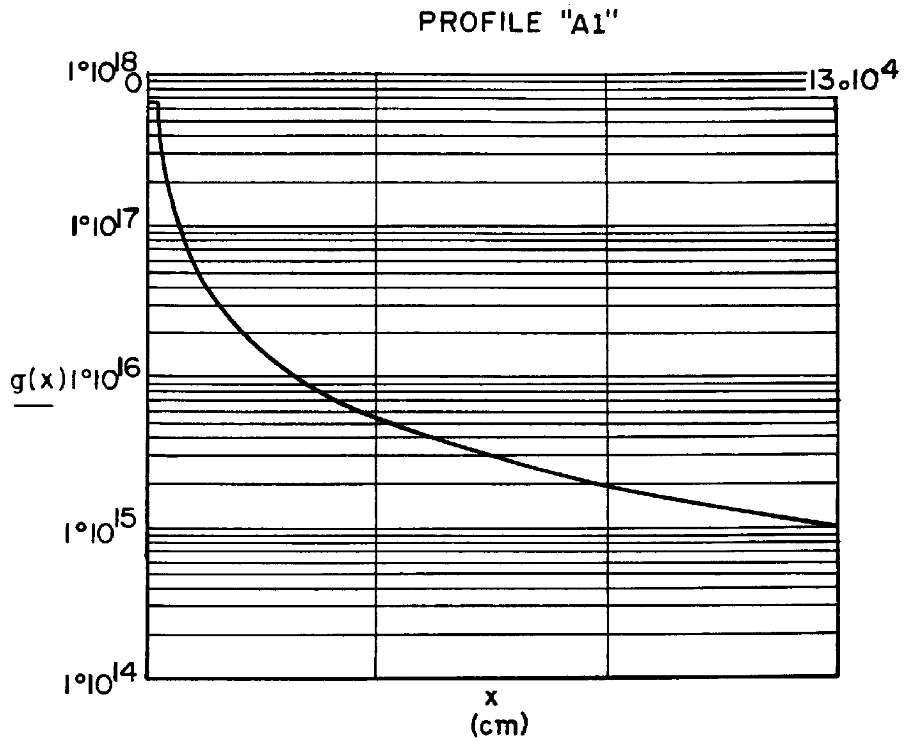
FIG. 5 is a graphical representation of a doping distribution profile of the active region of the varactor of FIG. 4.

A common varactor similar to that depicted in FIG. 4 may have an active layer 416 having thickness in the order of 15,000 Angstroms and have an n-type doping distribution profile similar that as illustrated in FIG. 5, and have a contact layer 414 in the order of 7,000 Angstroms with an $n^+$-type doping in the order of $5\times10^{18}cm^{-3}$. The aforedescribed varactor may be fabricated by a wide variety of techniques in conjunction with the transmission line components as already described with reference to FIG. 2.

Figure 7:
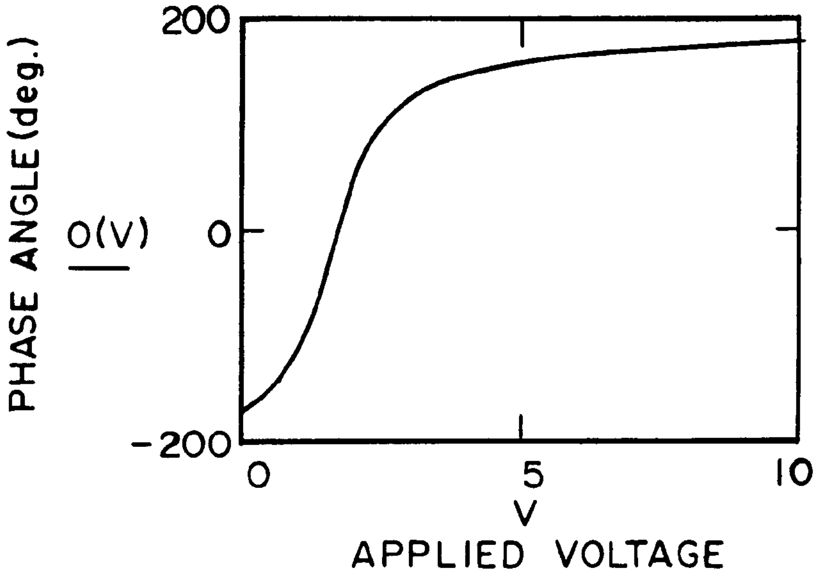
FIG. 7 is a graphical representation of a voltage-phase characteristic of the present invention employing a varactor having the doping distribution represented by FIG. 5.

FIG. 7 graphically illustrates the calculated performance of the phase angle modulator of FIG. 2 where the doping distribution profile for the active layer 416 of the varactors 32 and 38 is similar to that graphically depicted in FIG. 5. The performance characteristic as depicted in FIG. 7 illustrates the resultant phase shift as observed at the output voltage (node 16 of FIG. 3) versus bias input voltage signal (block 100 of FIG. 3). The modulator approximates linearity in the vicinity of the inflection point of the curve of FIG. 7. Although greater linearity over a larger range may be achieved with additional circuit component adjustments, the basic shape of the performance characteristic curve remains the same.

Figure 3:
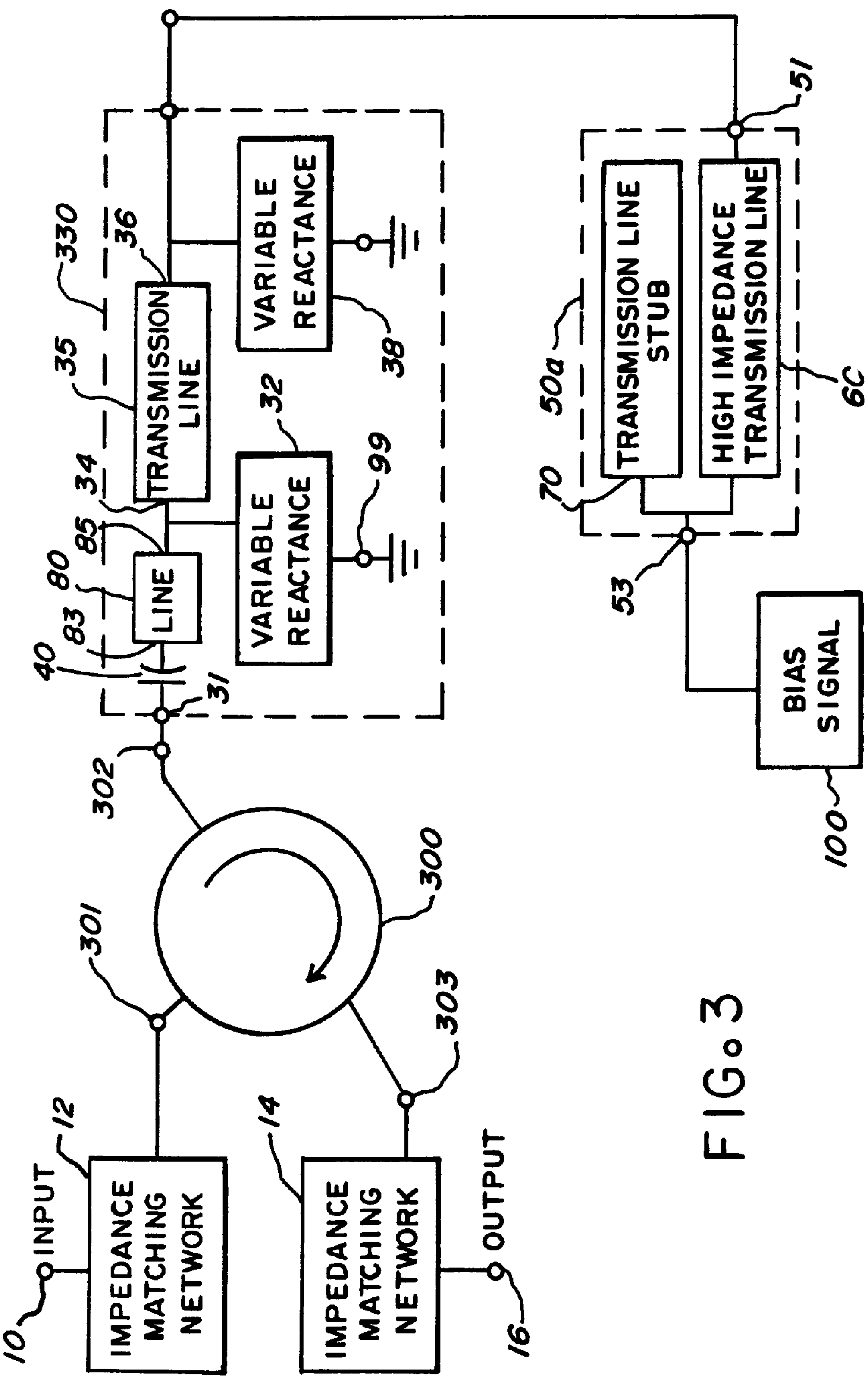
FIG. 3 is a schematic block diagram of a phase modulator of another embodiment of the present invention.
Figure 6:
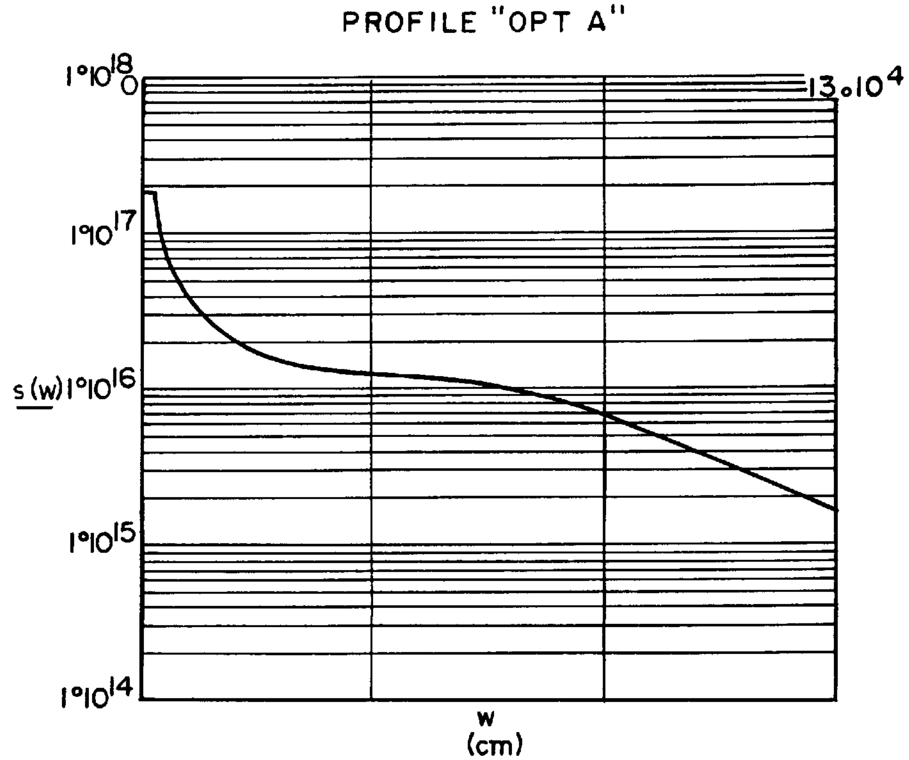
FIG. 6 is a graphical representation of another doping distribution of the active region of the varactor of FIG. 4.
Figure 8:
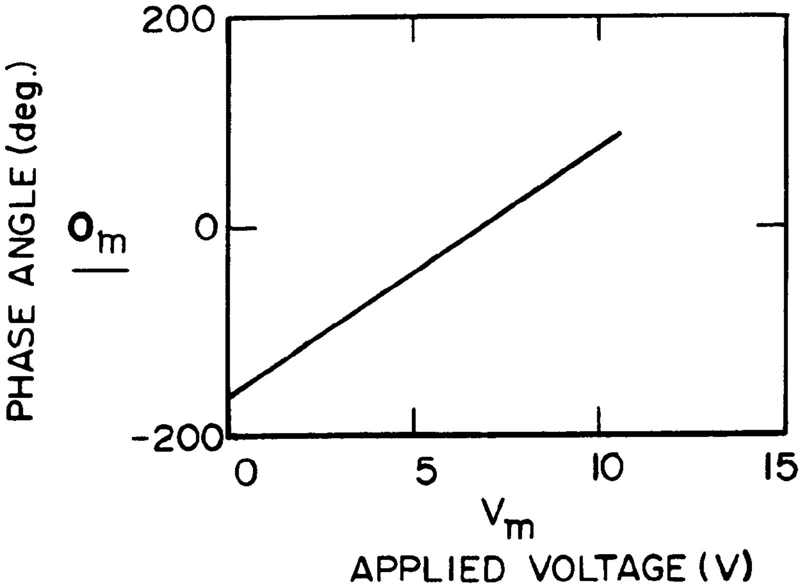
FIG. 8 is a graphical representation of a voltage-phase characteristic of the present invention employing a varactor having the doping distribution represented by FIG. 6.

In accordance with one aspect of the present invention, modification in a particular manner of the doping distribution profile of at least one region, namely, active layer 216 of varactors 32 and 38 was discovered to directly affect and enhance the phase linearity of the performance characteristic of the phase angle modulator of the present invention as particularly illustrated in FIGS. 2 and 3. Illustrated in FIG. 6 is a doping distribution profile mathematically derived to determine an optimum doping profile of the four varactors 32 and 38 of FIG. 2 to enhance the linearity of the performance characteristic of the phase angle modulator of the present invention. FIG. 8 graphically illustrates the calculated performance of the phase angle modulator of FIG. 2 where the doping distribution profile for the active layer 416 of the varactors 32 and 38 is similar to that graphically depicted in FIG. 6.

The mathematically derived doping profile as illustrated in FIG. 6 is optimized to maximize the resultant phase shift developed by the phase angle modulator of the present invention as a function of the applied (reverse) bias voltage. In other words, as the bias voltage is applied to the modulator circuit to shift the carrier phase, the varactor's capacitance-vs-voltage characteristic is designed to exactly compensate for the non-linear portion of other circuit components contribution to the shift in reflection coefficient as a function of varactor capacitance.

As illustrated in FIG. 8, the total phase shift range is limited on one end by a "built in bias voltage" (at 0 applied bias voltage the varactor exhibits maximum capacitance). On the other end, linearity is restricted due to the punch through condition—the applied bias voltage results in the depletion region of the varactor extending all the way to the contact layer 214 corresponding to a minimum capacitance. The performance characteristic as illustrated in FIG. 8 was achieved through use of GaAs varactor with a 1.5 micrometer thick n-layer having a doping profile as illustrated in FIG. 6. The total phase shift was found to be 252 electrical degrees at 32 GHz.

It should be noted that variable reactance means 32 & 38, as used herein, may be provided by both abrupt and hyperabrupt varactor diodes which may be constructed by way of a wide array of construction techniques including, but limited to, those described in the above recited patents and papers. In particular, U.S. Pat. Nos. 3,914,708, 5,014,018, and 5,557,140 each describe various techniques for designing a varactor diode having predetermined capacitance-voltage characteristics in accordance with a predetermined doping profile for PN junction and Schottky junction varactor diodes comprised of a number of layers or regions. In accordance with the present invention, it should be recognized by those skilled in the art, that any variable reactance means may be constructed to have a predetermined capacitance-voltage characteristic by selection of a doping profile of at least one of the semiconductor regions which will affect the capacitance-voltage characteristic of the varactor diode so as to compensate for the non-linear portion of the phase modulator circuit's contribution to the shift in reflection coefficient as a function of varactor capacitance.

Capacitance 40 of each of the variable reactance networks is intended to serve as a de-coupling capacitor, and is in the order of 5 pico-farads.

The purpose of the analog phase modulator in accordance with the present invention is to impart a linear phase shift to an input carrier signal provided as the input signal to input port 22 of quadrature signal coupler 20 directly proportional to the applied bias signal at bias port 110 as provided by bias signal source 100. The circuit of FIG. 1 is particularly applicable for the higher frequencies such as mm-wave frequencies in the Gigahertz range. In accordance with the present invention, the phase shift is imparted directly to the input signal without the need for additional circuitry such as frequency mixers which up-converts from a lower intermediary carrier signal frequency before being translated to the generally high frequency input signal.

In accordance with the present invention, input power is divided equally at both the in-phase and phase-shifted ports output 24 and 26. Each of these ports are coupled to identical variable reactance networks 30*a* and 30*b*, respectively, through identical input capacitances 40. A bias signal is symmetrically applied to the variable reactance networks through identical bias filter networks comprised of a high impedance transmission line segment shunted by a low impedance transmission line segment. These bias filters serve to isolate the modulated carrier frequency from the bias signal source and vice versa. With this circuit arrangement, a highly linear low loss phase modulator is achieved for phase shift variation of approximately 200 to 300 degrees.

The simplistic circuit design as illustrated in FIG. 1 leads to a small chip area of an integrated circuit when implemented as a Monolithic Microwave Integrated Circuit (MMIC). In turn, this leads to higher system efficiency, i.e., lower power consumption, lower loss, and greater linearity, and at the same time be a lower cost implementation over that achieved in the prior art. Furthermore, the simplistic design also results in phase shift response time versus applied bias signal source change thereby achieving a wider bandwidth in the order of 300 MHz, and at the same time maintaining linearity over the entire bandwidth with a peak deviation from linear of less than 6%.

Illustrated in FIG. 3 is a schematic block diagram of an alternate arrangement to that of FIG. 1 in accordance with the present invention. In FIG. 3 similar functioning components like those described with reference to FIG. 1 have retained the same numeral designation in FIG. 3.

In FIG. 3, a 3-port circulator 300 has been employed in place of the 4-port 3-dB quadrature signal coupler 20, and only one variable reactance impedance circuit 330, identical to impedance network 30*a*, is utilized. The 3-port circulator may be used in place of the aforementioned "4 port" couplers to separate the input from the output signal. In this case only a single variable reactance terminating impedance network is required. Here the conventional notation for a circulator is used where the low loss paths are from ports 301 to 302, 302 to 303, and 303 to 301 as illustrated in FIG. 3. In the embodiment of present invention illustrated in FIG. 3, the carrier signal is incident at port 301 (corresponding to port 22 of FIG. 1). The terminating variable reactance network 330 is connected to port 302 (corresponding to port 24 in FIG. 1). The phase shifted output is taken at port 303 (corresponding to port 28 in FIG. 1).

Employment of the novel reactance network 330 as already described provides the aforementioned higher system efficiency, i.e., lower power consumption, lower loss, and greater linearity, and at the same be a lower cost implementation over that achieved in the prior art.

The invention has been described herein in considerable detail in order to comply with the Patent Statutes and to provide those skilled in the art with the information needed to apply the novel principles of the present invention, and to construct and use such exemplary and specialized components as are required. However, it is to be understood that the invention may be carried out by specifically different equipment and devices, and that various modifications, both as to the equipment details and operating procedures, may be accomplished without departing from the true spirit and scope of the present invention.

In particular, it should be noted that only a pair of cascaded variable reactance devices have been illustrated in the drawings. It is of course possible to cascade one or more additional transmission line segments of approximately ¼ wavelength long followed by an additional variable reactance device, and such is intended to be within the true spirit and scope of the present invention. The same is also true with regard to FIG. 3, i.e., additional cascaded variable reactance devices may also be employed.

Lastly, additional transmission line segments serially connected, or serving as shunts may be added to the embodiments of the present invention without departing from the true spirit and scope of the present invention.

The embodiments of an invention in which an exclusive property or right is claimed are defined and claimed as follows:

1. An analog phase modulator operable for linearly phase modulating an input signal in relation to an applied bias signal, said analog phase modulator comprising:

a quadrature signal coupler having an input port for receiving an input signal, an output port for providing an output signal derived from said input signal, an in-phase terminating port, a quadrature phase-shifted terminating port, and an electrical ground;

first and second variable reactance networks where each of said first and second variable reactance networks includes, first and second electrical node terminating means, a first transmission line segment having a first transmission line terminating end means coupled to said first electrical node terminating means through a series connected capacitance, and having a second transmission line terminating end means, a second transmission line segment having a first transmission line terminating end means electrically connected to said second terminating end means of said first transmission line segment, and having a second transmission line terminating end means electrically connected to said second electrical node terminating means, a first variable reactance means for providing a variable reactance which varies in relation to said applied bias signal, said variable reactance having a first reactance terminating means electrically connected to said first terminating end means of said second transmission line segment and a second reactance terminating means coupled to said electrical ground, and a second variable reactance means for providing a variable reactance which varies in relation to said applied bias signal, said variable reactance having a first reactance terminating means electrically connected to said second terminating end means of said second transmission line segment, and a second reactance terminating means coupled to said electrical ground;

means for electrically connecting said first electrical node terminating means of said first variable reactance network directly to said in-phase terminating port;

means for electrically connecting said first electrical node terminating means of said second variable reactance network directly to said phase-shifted terminating port; and a bias input port means for receiving said applied bias signal, said bias input port means electrically connected to said second electrical node terminating means of said first variable reactance network, and to said second electrical node terminating means of said second variable reactance network.

2. The analog phase modulator claim 1 further comprising:

a first bias filter network including a third transmission line segment electrically connected between said bias means and said second electrical node terminating means of said first variable reactance network, and a fourth transmission line segment electrically connected as a shunt at the juncture of said third transmission line segment and said bias input port means; and a second bias filter network including a fifth transmission line segment electrically connected between said bias input port means and said electrical node terminating means of said second variable reactance network, and a sixth transmission line segment electrically connected as a shunt at the juncture of said fifth transmission line segment and said bias input port means.

3. The analog phase modulator of claim 2 is symmetrically implemented on a monolithic integrated circuit.

4. The analog phase modulator of claim 3 where in said first and second variable reactance means is a varactor diode selected from the group consisting of PN junction and Schottky junction varactor diodes including at least one semiconductor region, and wherein the capacitance voltage characteristic is predetermined in accordance with selected doping profiles of said at least one selected regions, and where said predetermined capacitance voltage characteristic is selected so as to compensate for other circuit component induced non-linearities and enhance linearity of phase modulating said input signal in proportion to said applied bias signal.

5. The analog phase modulator of claim 2 wherein in said second, third, and fifth transmission line segments have a length substantially equal to ¼ of wavelength of the intended operating input signal frequency.

6. The analog phase modulator of claim 5 wherein:

the characteristic impedance of said first and second transmission line segment is in the order of 50 ohms, the characteristic impedance of said third and fifth transmission line segments is greater than said characteristic impedance of said second transmission line segments, and the characteristic impedance of said fourth and sixth transmission line segments is less than said characteristic impedance of said second transmission line segments.

7. The analog phase modulator of claim 5 wherein:

the characteristic impedance of said first and second transmission line segments is substantially 50 ohms, the characteristic impedance of said third and fifth transmission line segments is approximately 70 ohms, and the characteristic of said fourth and sixth transmission line segments is 30 ohms.

8. The analog phase modulator of claim 1 is symmetrically implemented on a monolithic integrated circuit.

9. The analog phase modulator claim 1 where in said second transmission line segment has a length substantially equal to ¼ of the wavelength of the intended operating input signal.

10. The analog phase modulator of claim 1 wherein the characteristic impedance of said first and second transmission line segments is in order of 50 ohms.

11. The analog phase modulator of claim 1 where in each of said first and second variable reactance means is a varactor diode.

12. The analog phase modulator of claim 11 where in each of said first and second variable reactance means is a hyperabrupt varactor diode.

13. The analog phase modulator of claim 1 where in said first and second variable reactance means is a varactor diode having a selected capacitance voltage characteristic so as to compensate for other circuit component induced non-linearities and enhance linearity of phase modulating said input signal in proportion to said applied bias signal.

14. The analog phase modulator of claim 1 where in said first and second variable reactance means is a varactor diode selected from the group consisting of PN junction and Schottky junction varactor diodes including at least one semiconductor region, and wherein the capacitance voltage characteristic is predetermined in accordance with selected doping profiles of said at least one selected regions, and where said predetermined capacitance voltage characteristic is selected so as to compensate for other circuit component induced non-linearities and enhance linearity of phase modulating said input signal in proportion to said applied bias signal.

15. An analog phase modulator operable for linearly phase modulating an input signal in relation to an applied bias signal, said analog phase modulator comprising:

a 3-port signal circulator having in sequence, an input port for receiving an input signal, a first output port, and a second output port for providing an output signal derived from said input signal, and said 3-port signal circulator further including an electrical ground;

a variable reactance network including, first and second electrical node terminating means, a first transmission line segment having a first transmission line terminating end means coupled to said first electrical node terminating means through a series connected capacitance, and having a second transmission line terminating end means, a second transmission line segment having a first transmission line terminating end means electrically connected to said second terminating end means of said first transmission line segment, and having a second transmission line terminating end means electrically connected to said second electrical node terminating means, a first variable reactance means for providing a variable reactance which varies in relation to said applied bias signal, said variable reactance means having a first reactance terminating means electrically connected to said first terminating end means of said second transmission line segment, and a second reactance terminating means coupled to said electrical ground, and a second variable reactance means for providing a variable reactance which varies in relation to said applied bias signal, said variable reactance means having a first reactance terminating means electrically connected to said second transmission line terminating end means of said second transmission line segment, and a second reactance terminating means coupled to said electrical ground;

means for electrically connecting said first electrical node terminating means of said variable reactance network directly to said first output port of said circulator; and a bias input port means for receiving said applied bias signal, said bias input port means electrically connected to said second electrical node terminating means of said variable reactance network.

16. The analog phase modulator of claim 15 where in said second transmission line segment has a length substantially equal to ¼ of the wavelength of the intended operating input signal.

17. The analog phase modulator of claim 15 wherein the characteristic impedance of said first and second transmission line segment means is in the order of 50 ohms.

18. The analog phase modulator of claim 15 where in said first, second, and third transmission line segment means have a length substantially equal to the ¼ wavelength of the intended operating input signal.

19. The analog phase modulator of claim 15 further comprising:

a bias filter network including a third transmission line segment electrically connected between said bias input port and said second electrical node terminating means of said variable reactance network, and a fourth transmission line segment electrically connected as a shunt at the junction of said third transmission line segment and said bias input means.

20. The analog phase modulator of claim 19 wherein:

the characteristic impedance of said first and second transmission line segment means is substantially 50 ohms, the characteristic impedance of said third transmission line segment means is approximately 70 ohms, and the characteristic impedance of said fourth transmission line segment means is 30 ohms.

21. The analog phase modulator of claim 19 wherein:

the characteristic impedance of said first and second transmission line segment means is in the order of 50 ohms, the characteristic impedance of said third transmission line segment means is greater than said characteristic impedance of said second transmission line segment means, and the characteristic impedance of said fourth transmission line segment means is less than said characteristic impedance of said second transmission line segment means.

22. The analog phase modulator of claim 15 where in each of said first and second variable reactance means is a varactor diode.

23. The analog phase modulator of claim 22 where in each of said first and second variable reactance means is a hyperabrupt varactor diode.

24. The analog phase modulator of claim 15 where in said first and second variable reactance means is a varactor diode having a selected capacitance voltage characteristic so as to compensate for other circuit component induced non-linearities and enhance linearity of phase modulating said input signal in proportion to said applied bias signal.

25. The analog phase modulator of claim 15 where in said first and second variable reactance means is a varactor diode selected from the group consisting of PN junction and Schottky junction varactor diodes including at least one semiconductor region, and wherein the capacitance voltage characteristic is predetermined in accordance with selected doping profiles of said at least one selected regions, and where said predetermined capacitance voltage characteristic is selected so as to compensate for other circuit component induced non-linearities and enhance linearity of phase modulating said input signal in proportion to said applied bias signal.

26. A variable reactance network adapted to receive a bias control signal at a bias input port, and an output port adapted to be connected to a microwave or mm-wave power dividing signal coupler, said variable reactance network comprising:

a bias input port for receiving said bias source signal and an output port adapted to be connected to a microwave or mm-wave power dividing signal coupler;

a first transmission line segment having a first transmission line terminating end means coupled to said output port through a series connected capacitance, and having a second terminating end means;

a second transmission line segment having a first transmission line terminating end means electrically connected to said second terminating end means of said first transmission line segment, and having a second terminating end means electrically connected to said bias input port;

a first varactor diode for providing a variable reactance which varies in relation to said bias control signal, said varactor diode having a first reactance terminating means electrically connected to said first terminating end means of said second transmission line segment, and a second reactance terminating means coupled to said electrical ground;

a second varactor diode for providing a variable reactance which varies in relation to said bias control signal, said varactor diode having a first reactance terminating means electrically connected to said second transmission fine terminating end means of said second transmission line segment, and a second reactance terminating means coupled to said electrical ground; and a bias filter network including a third transmission line segment electrically connected between said bias input port and the juncture of said first reactance terminating means of said second variable reactance means, and a fourth transmission fine segment electrically connected as a shunt at the juncture of said bias input port and said third transmission line segment.

27. The analog phase modulator of claim 26 wherein:

the characteristic impedance of said first and second transmission line segment is in the order of 50 ohms;

the characteristic of said third transmission line segment is greater than said characteristic impedance of said second transmission line segment; and the characteristic of said fourth transmission line segment is less than said characteristic impedance of said second transmission line segment.

28. The analog phase modulator of clam 26 wherein:

the characteristic impedance of said first and second transmission line segment is substantially 50 ohms;

the characteristic impedance of said third transmission line segment is approximately 70 ohms; and the characteristic impedance said fourth transmission line segment is 30 ohms.

29. A variable reactance network adapted to receive a bias control signal at a bias input port, and an output port adapted to be connected to a microwave or mm-wave power dividing signal coupler, said variable reactance network comprising:

a bias input port for receiving said bias source signal and an output port adapted to be connected to a microwave or mm-wave power dividing signal coupler;

a first transmission line segment having a first transmission line terminating end means coupled to said output port through a series connected capacitance, and having a second terminating end means;

a second transmission line segment having a first transmission line terminating end means electrically connected to said second terminating end means of said first transmission line segment, and having a second terminating end means electrically connected to said bias input port;

a first varactor diode for providing a variable reactance which varies in relation to said bias control signal, said varactor diode having a first reactance terminating means electrically connected to said first terminating end means of said second transmission line segment, and a second reactance terminating means coupled to said electrical ground;

a second varactor diode for providing a variable reactance which varies in relation to said bias control signal, said varactor diode having a first reactance terminating means electrically connected to said second transmission line terminating end means of said second transmission line segment, and a second reactance terminating means coupled to said electrical ground; and wherein said first and second varactor diodes each have a selected capacitance voltage characteristic so as to compensate for other circuit component induced nonlinearities and enhance linearity of phase modulating said input signal in proportion to said applied bias signal.

30. A variable reactance network adapted to receive a bias control signal at a bias input port, and an output port adapted to be connected to a microwave or mm-wave power dividing signal coupler, said variable reactance network comprising:

a bias input port for receiving said bias source signal and an output port adapted to be connected to a microwave or mm-wave power dividing signal coupler;

a first transmission line segment having a first transmission line terminating end means coupled to said output port through a series connected capacitance, and having a second terminating end means;

a second transmission line segment having a first transmission line terminating end means electrically connected to said second terminating end means of said first transmission line segment, and having a second terminating end means electrically connected to said bias input port;

a first varactor diode for providing a variable reactance which varies in relation to said bias control signal, said varactor diode having a first reactance terminating means electrically connected to said first terminating end means of said second transmission line segment, and a second reactance terminating means coupled to said electrical ground;

a second varactor diode for providing a variable reactance which varies in relation to said bias control signal, said varactor diode having a first reactance terminating means electrically connected to said second transmission line terminating end means of said second transmission line segment, and a second reactance terminating means coupled to said electrical ground; and wherein said first and second varactor diodes are each selected from the group consisting of PN junction and Schottky junction varactor diodes including at least one semiconductor region, and wherein the capacitance voltage characteristic of each of said first and second varactor diodes is predetermined in accordance with selected doping profiles of said at least one semiconductor region, and where said predetermined capacitance voltage characteristic is selected so as to compensate for other circuit component induced nonlinearities and enhance linearity of phase modulating said input signal in proportion to said applied bias signal.

* * * * *